United States Patent [19]

Narita et al.

[11] 4,305,088
[45] Dec. 8, 1981

[54] SEMICONDUCTOR DEVICE INCLUDING MEANS FOR ALLEVIATING STRESS CAUSED BY DIFFERENT COEFFICIENTS OF THERMAL EXPANSION OF THE DEVICE COMPONENTS

[75] Inventors: Kazutoyo Narita; Tadashi Sakaue; Noboru Kawasaki; Motoji Nakajima, all of Hitachi, Japan

[73] Assignees: Hitachi, Ltd.; Hitachi Haramachi Semi-Conductor, Ltd., both of Tokyo, Japan

[21] Appl. No.: 195,941

[22] Filed: Oct. 10, 1980

Related U.S. Application Data

[63] Continuation of Ser. No. 911,310, Jun. 1, 1978, abandoned.

[30] Foreign Application Priority Data

Jun. 7, 1977 [JP] Japan .................. 52-67604

[51] Int. Cl.³ .............. H01L 23/42; H01L 23/44; H01L 23/46
[52] U.S. Cl. ........................... 357/79; 357/72; 357/74; 357/75; 357/81
[58] Field of Search ............. 357/72, 74, 73, 75, 357/76, 79, 81

[56] References Cited

U.S. PATENT DOCUMENTS

| | | | |
|---|---|---|---|
| 2,597,734 | 5/1952 | James et al. | 357/79 |
| 2,671,189 | 3/1954 | Gaudlitz | 357/79 |
| 2,712,619 | 7/1955 | Zetno | 357/79 |
| 2,779,903 | 1/1957 | Geppert | 357/79 |
| 2,869,053 | 1/1959 | Schaper | 357/79 |
| 2,927,953 | 3/1960 | Staller | 357/79 |
| 3,050,666 | 8/1962 | Stump | 357/73 |
| 3,258,661 | 6/1966 | Mierendorf | 357/81 |
| 3,612,957 | 10/1971 | Steigerwald | 357/79 |
| 3,925,809 | 12/1975 | Striker | 357/81 |
| 4,057,825 | 11/1977 | Narita et al. | 357/81 |

FOREIGN PATENT DOCUMENTS

| | | | |
|---|---|---|---|
| 2337139 | 2/1974 | Fed. Rep. of Germany | 357/79 |
| 47-40289 | 6/1972 | Japan | 357/79 |

*Primary Examiner*—Andrew J. James
*Attorney, Agent, or Firm*—Craig and Antonelli

[57] ABSTRACT

A semiconductor device comprises a heat-radiating electrode plate, a semiconductor element soldered to the depressed portion formed in the heat-radiating electrode plate, a header lead soldered onto the semiconductor element, a terminal board of insulating material fixed on the heat-radiating electrode plate, and a lead terminal secured to the terminal board and with the one end thereof electrically and mechanically connected to the header lead. The semiconductor device further comprises means for mitigating the transmission to the solder of the stress generated along the length of the header lead by the difference in the coefficient of thermal expansion among the component parts, and means for alleviating the lateral stress generated in the solder by the difference in the coefficient of thermal expansion between the header lead and the semiconductor element. Thus, a semiconductor device is provided which is high in both resistance to thermal fatigue and vibrations, simple in construction and superior in operational efficiency.

21 Claims, 17 Drawing Figures

SEMICONDUCTOR DEVICE INCLUDING MEANS FOR ALLEVIATING STRESS CAUSED BY DIFFERENT COEFFICIENTS OF THERMAL EXPANSION OF THE DEVICE COMPONENTS

This is a continuation of application Ser. No. 911,310, filed June 1, 1978.

LIST OF PRIOR ART REFERENCES (37 CFR 1.56(a))

The following references are cited to show the state of the art:

1. U.S. Pat. No. 4,057,825, Kazutoyo Narita et al, Nov. 8, 1977, 357/81
2. Japanese Utility Model Application Laid-Open No. 73410/77, June 1, 1977

BACKGROUND OF THE INVENTION

This invention relates to a semiconductor device, or more in particular to a structure of a semiconductor rectifier.

The required specifications of a semiconductor device vary with the intended applications thereof. In particular, high reliability in the resistance to thermal fatigue and vibrations is required for a semiconductor rectifier or the like used for rectification in an AC generator for an automobile, which comprises heat-radiating plates making up anode electrodes (or cathode electrodes), semiconductor elements soldered to the heat-radiating plates, and header leads soldered onto the semiconductor elements and functioning as cathode electrodes (or anode electrodes), the header leads being connected to lead terminals electrically and mechanically. While an automobile engine is running, the output current of the AC generator changes with engine revolutions independently of whether the automobile is running or stationary. At the same time, the heat generated in the semiconductor device and the temperature within the engine room undergo a change, while the semiconductor device is subjected to vibrations. As a result of these temperature changes, the component parts constituting the semiconductor device are subjected to expansion and contraction. Further, since vibrations occur along the length of the header leads and also in the lateral directions thereof, the resulting stress is repeatedly applied to the solder interposed between the semiconductor elements and the header leads, often causing the breakdown of the solder due to thermal fatigue.

SUMMARY OF THE INVENTION

An object of the present invention is to provide, in order to solve the above-mentioned problem of breakdown, a semiconductor device having a structure capable of minimizing the stress applied to a solder thereby improving its resistance to thermal fatigue.

Another object of the present invention is to provide a semiconductor device in which no stress is applied to the semiconductor elements in the course of fabrication, and which is simple in construction, and high in operational efficiency, resistance to vibrations and mechanical strength.

Still another object of the present invention is to provide a low-cost semiconductor device capable of resisting a surge current.

A further object of the invention is to provide a semiconductor device having a protective film high in resistance to solvents and heat in order to make the air-tightness of the silicon rubber much better than that of the prior art.

According to one feature of the present invention, in order to achieve the above-mentioned objects, the lead sections of the header leads and/or lead terminals are provided with stress-alleviating means, thereby reducing transmission of the stress generated along the length of the header leads to the solder.

According to another feature of the invention, in order to achieve the above-mentioned objects, spacers made of a material lower in the coefficient of thermal expansion than the lead sections of the header leads are inserted between the heat-radiating plates and the terminal board.

According to a third feature of the invention, the header sections of the header leads are made of iron, thereby reducing the horizontal stress generated in the solder.

DETAILED DESCRIPTION OF THE INVENTION

First, in order to facilitate the understanding of the present invention, the construction of a conventional semiconductor device will be described with reference to the accompanying drawings.

Figure 1:
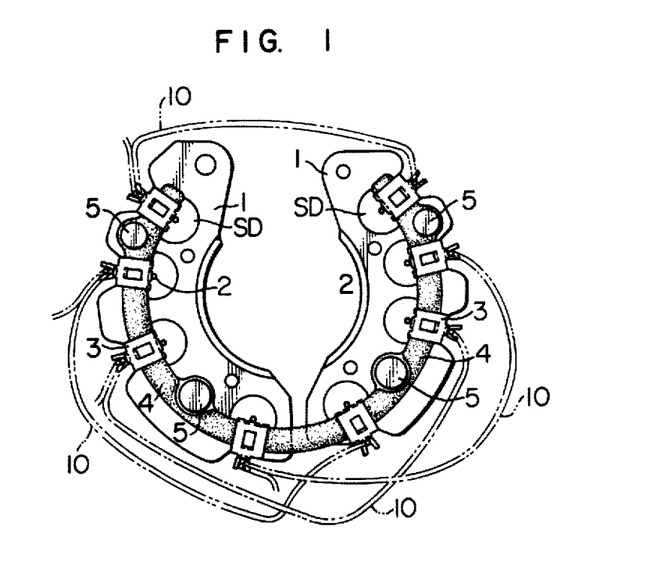
FIG. 1 is a diagram for explaining the structure of a conventional rectifier built in the AC generator for automobiles.

The diagram of FIG. 1 shows the structure of a conventional semiconductor device used for rectification in the AC generator for the automobiles. In FIG. 1, reference numeral 1 designates a pair of circular arc-shaped heat-radiating electrode plates usually mounted on the end bracket of an AC generator, reference character SD rectifier elements coupled in the depressed portions of the heat-radiating electrode plates, numeral 2 header leads of the rectifier elements SD, numeral 3 lead terminals electrically and mechanically connected to the top ends of the header leads, numeral 4 a pair of circular arc-shaped terminal board, numeral 5 pins for fastening the terminal board 4 to the heat-radiating electrode plates 1, and numeral 10 wiring cables for connecting the output of the AC generator to lead terminals at their U-shaped ends.

Figure 2:
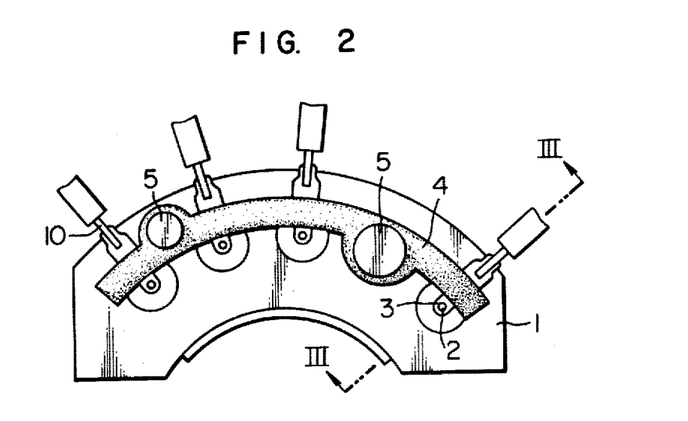
FIG. 2 is a top plan view of a conventional semiconductor device.
Figure 3:
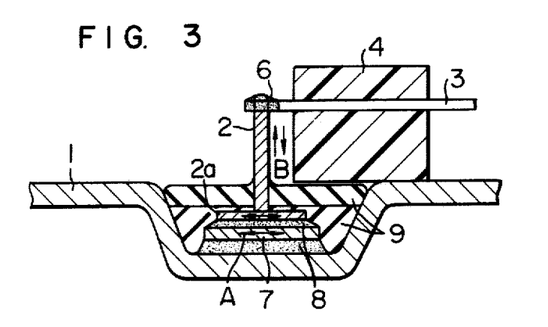
FIG. 3 is a longitudinal sectional view taken in line A—A in FIG. 2.

Another example of the structure of the semiconductor device used for rectification in the AC generator for automobiles, which is fabricated in the conventional manner, is shown in FIGS. 2 and 3. Referring to FIGS. 2 and 3, a solder 8, a semiconductor element 7, another solder 8 and a header lead 2 of copper material are set sequentially in the depressed portion of the heat-radiating electrode plate 1 made of iron or copper. These parts are coupled to each other by melting the solders in a heating oven having a temperature higher than a melting point of the solders 8. After that, a surface treatment agent 9 is filled as a protective material for the coupling portion of the semiconductor element 7. Further, the top end of the header lead 2 is connected by solder 6 to the lead terminal 3 for connection with an AC power supply, which lead terminal is embeded within the terminal board 4 made of an epoxy resin. The terminal board 4 is secured to the heat-radiating electrode plate 1 by means of the fastening pins. 5.

When a heat cycle is applied to the semiconductor device, as described above, the solder 8 interposed between the header section 2a of the header lead 2 and the semiconductor element 7 is subjected to a thermal contraction in the horizontal directions shown by the arrow A due to the difference in the coefficient of thermal expansion between silicon and copper that is the material of the header section. Further, the difference in the thermal expansion coefficient between header lead 2 and the terminal board 4 and the vibrations attributable to engine operation cause the vertical tension and compressive force in the assembly in the directions shown by arrow B.

Assuming that the semiconductor device is subjected to heat cycles while the automobile is running, a thermal fatigue aging test has been conducted in which each heat cycle includes a step of supplying a three-phase output current, a step of increasing a temperature of the heat-radiating electrode plate 1 up to 150° C. for one minute, a step of cutting off the current, and a step of reducing the temperature of the heat-radiating plate 1 down to 50° C. within 2 minutes. As a result, it has been found out that the conventional device has a standard life of about 5,000 cycles at the failure rate of 50%.

In order to improve the thermal fatigue resistance of the device, the semiconductor device according to the present invention is characterized in that a material of the header section 2a of the header lead 2 nearer than the conventional copper material with respect to silicon in the coefficient of thermal expansion is employed and that the header lead 2 is provided with a U-shaped bent part to reduce the tension and compressive force of the header lead 2.

Figure 4:
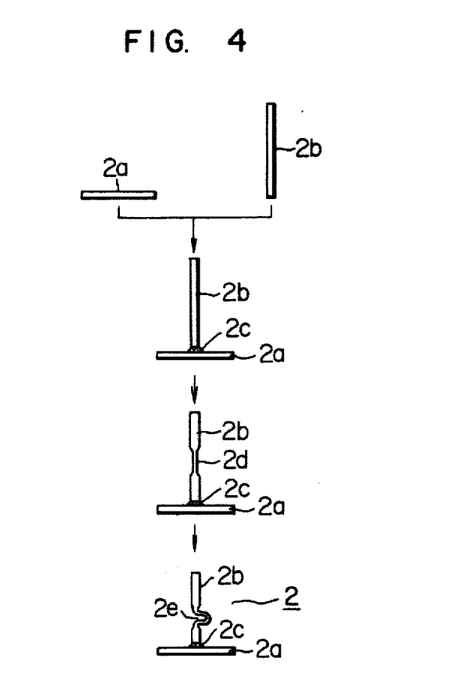
FIG. 4 is a diagram showing the processes of fabrication of the header lead according to a first embodiment of the present invention.

A first embodiment of the present invention will be described below. The diagram of FIG. 4 shows the processes of fabrication of the header lead used in the semiconductor device.

First, an iron plate 0.2 mm to 0.3 mm thick is blanked in circular or rectangular form thereby making the header section 2a. A copper wire is cut to the required size, thereby making the lead section 2b. The diameter of the copper wire should be determined in accordance with the current capacity of the semiconductor device. The lead section 2b is set on the header section 2a in a position perpendicular thereto, and after connecting them with each other by means of a solder material 2c, the intermediate part of the lead section 2b is pressed to form a flat part 2d. This flat part 2d is bent, thereby forming a U-shaped bent portion 2e. By taking a rust-preventing measure such as nickel plating on the assembly, the header lead 2 according to the present invention is completed.

By a method similar to the one for the conventional semiconductor device as described above, the header lead 2 according to the present invention is connected by solder 8 to the heat-radiating electrode plate 1 and the semiconductor element 7, and then the surface treatment agent 9 is added thereto, thus completing the semiconductor device according to the first embodiment of the present invention.

Under this condition, the U-shaped bent portion 2e of the header lead 2 is located outside of the surface treatment agent 9 in order that the surface treatment agent 9 will not be separated from the heat-radiating electrode plate by the alleviating action of the U-shaped bent portion 2e.

According to a semiconductor assembly of the present invention, a pair of heat-radiating electrode plates 1 are used as a positive and a negative electrode of this semiconductor assembly, respectively. The heat-radiating electrode plates 1 are formed into a circular arc shape and are mounted on an end bracket of an AC generator over the same circumference and symmetrically with respect to the diameter. The individual heat-radiating electrode plates 1 are provided with four depressed portions on the same circumference in each of which a semiconductor element 7 is soldered to the heat-radiating electrode plate 1 and the header lead 2 by the same method as mentioned above. On the individual heat-radiating electrode plates 1, a terminal board 4 of insulating material is fixed along the outer periphery of the respective heat-radiating electrode plates 1, and on the terminal board 4, four plane copper plate lead terminals 3 are mounted so as to extend in a radial direction of the heat-radiating electrode plate, The end of the lead terminal 3 to be connected with the header lead 2 is provided with an opening U-shaped in the radial direction, and the terminal board 4 is fixed on the respective heat-radiating electrode plates so that the outer periphery of the heat-radiating electrode plates 1 is located on the outer periphery side of the terminal board 4 and the semiconductor elements 7 are disposed on the inner periphery side of the terminal board 4, and besides the inner periphery of the terminal board 4 cover at least part of the depressed portions of the heat-radiating electrode plates 1. The places in which the terminal board 4 is fixed on the heat-radiating electrode plate 1 by the fastening pins 5 are different from the places in which the lead terminals 3 are fixed onto the terminal board 4 by the fastening pins 5 so as to extend in the radial direction. As described in the first embodiment of the invention, the header lead 2 is provided with a U-shaped bent part capable of reducing the tension and compressive force applied thereto. In addition, the lead terminals 3 may be embedded into the terminal board 4 so as to project from the inner and outer peripheries of the terminal board 4 in the radial direction of the heat-radiating electrode plate 1.

Figure 5:
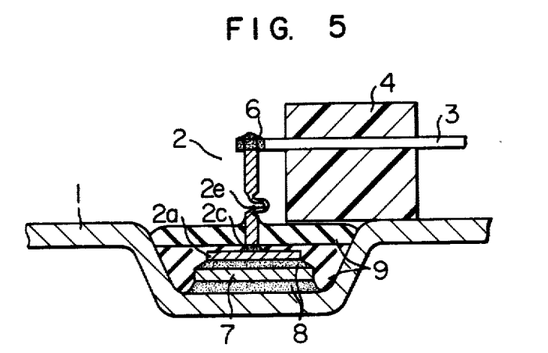
FIG. 5 is a longitudinal sectional view of a semiconductor device using the header leads fabricated as shown in FIG. 4, according to a first embodiment of the present invention.

A sectional view of the semiconductor device according to the first embodiment of the present invention is shown in FIG. 5. According to the first embodiment of the present invention, the header section 2a is made of iron but not copper and therefore has a coefficient of thermal expansion of from $17 \times 10^{-6}/°C$. to $12 \times 10^{-6}/°C$., which is less different from the thermal expansion coefficient of silicon of $3.5 \times 10^{-6}/°C$. than the copper material used for the conventional device. As a consequence, the stress of the solder 8 interposed between the header section 2a and the semiconductor element 7 is reduced accordingly. The stress of the solder 8 is further decreased in view of the fact that the vertical tension and compressive force are absorbed by the U-shaped bent portion 2e.

The results of a thermal fatigue aging test conducted on the above-mentioned semiconductor device according to the present invention under the same conditions as the test for the conventional semiconductor device show that the useful life of the semiconductor device is improved up to 10,000 cycles at the cumulative failure rate of 50%.

The first embodiment of the present invention was explained with reference to the rectifier for the AC generator of the automobile. The same advantages are of course achieved for the other semiconductor devices.

According to the semiconductor assembly of the present invention, the depressed portions are disposed on the heat-radiating electrode plate 1 substantially over the same circumference, so that the feeding of the semiconductor element 7 and the solder 8 into the depressed portion by an automatic machine may be facilitated and the component parts may be assuredly disposed at the predetermined position, and accordingly the individual semiconductor elements 7 may be assuredly soldered at the predetermined position with accuracy and isolated from the external atmosphere, and the soldering connection between the head lead and the lead terminal stretching out in a radial direction may be easily and uniformly made without applying any stress to the semiconductor element 7.

In addition, according to the semiconductor assembly of the present invention, the one end of the lead terminal 3 connected to the header lead 2 is provided with an opening U-shaped so that the opening is located in a radial direction, so that the stress applied to the semiconductor element 7 may be reduced by disposing the header lead 2 so that the direction in which the header lead 2 provides a maximum cushion effect is the radial direction, and accordingly the feeding of the component parts by an automatic machine may be facilitated. Besides, the insulation and fixation between the lead terminals 3 and the heat-radiating electrode plate 1 may be assured and, since the lead terminal 3 is flexible, it is high in resistance to vibrations and shock, so that any stress will not be applied to the semiconductor element 7 in use, and, furthermore, the terminal board 4 of the insulating material is mounted on the heat-radiating electrode plate 1 after the lead terminals 3 have been mounted on the terminal board, that is, the operation for mounting the terminal board 4 on the heat-radiating electrode plate 1 is carried out independently of the operation for mounting the lead terminals 3 on the terminal board 4, so that any stress will not be applied to the semiconductor element 7 during those operations. Since the fabrication is simple operation, the operational efficiency is increased up to approximately twice higher than that of the conventional semiconductor device.

Furthermore, according to the semiconductor assembly of the present invention, since the terminal board 4 is mounted on the heat-radiating electrode plate 1 so that the inner periphery of the terminal board 4 will cover part of the depressed portions of the heat-radiating electrode plate 1 and project over the molding material 9, the insulating distance becomes longer, so that the higher insulation breakdown voltage may be assured as compared with that of the conventional semiconductor device.

The terminal board 4 is disposed on the heat-radiating electrode plate 1 so that the outer periphery of the heat-radiating electrode plate 1 is disposed along the outer periphery side of the terminal board 4 and the semiconductor elements 7 is located on the inner periphery side of the terminal board 4 and that the lead terminals 3 project from the outer periphery of the terminal board 4 in a radial direction, so that the output coils of the AC generator may be disposed on the outer periphery portion of the bracket of the AC generator, and the isolating operation of the output coils from the armature as well as the connecting operation of the output coils to the lead terminals may be facilitated. Furthermore, a pair of heat-radiating electrode plates 1 are not assembled in the united body but separately mounted on less-vibrating portion inside the AC generator, so that the stress applied to the terminal board 4 may be reduced down to half as much as that of the conventional semiconductor device during the same acceleration of an automobile, and accordingly the strength of the terminal board 4 may be increased and the vibration resistance of the semiconductor assembly may be enhanced.

In addition, according to the semiconductor assembly of the present invention, the places in which the terminal board 4 is fixed by screws 5 to the heat-radiating electrode plate 1 are different from the places in which the lead terminals 3 are fixed by rivets to the terminal board 4, so that the thermal stress due to difference in the expansion coefficient of component parts between the heat-radiating electrode plate 1 and the terminal board 4 and the vibrations in operation are not applied direct to the header lead 2, and accordingly the semiconductor element 7 is free from damage. In that case, the insulation between the lead terminal 3 and the heat-radiating electrode plate 1 may be increased, so that the breakdown voltage of the semiconductor assembly may be increased.

The inventors have investigated the cause of the low resistance to thermal fatigue from many angles and found that the cause exists in the construction in which the mounting part of the header lead 2, i.e., the lead terminal 3 is embedded in the terminal board 4 of plastic. Referring back to the expansion in the direction of arrow B in FIG. 3 when the temperature of the semiconductor device arises. The thermal expansion coefficient of plastic is several times larger than that of copper and therefore the header lead 2 expands less than the terminal board 4. In view of the necessity that a large distance be provided between the surface of the coating material of the lead terminal 3 and the soldered portion in order to minimize the thermal effect of the soldering operation of the header lead 2 on the coating material, the lead terminal 3 of the conventional device is embedded in the terminal board 4 in proximity to the upper surface thereof (i.e., that surface of the terminal board 4 which is opposite to the side thereof in close contact with the heat-radiating electrode plate 1). Therefore, the lead terminal 3 is displaced upward by substantially the same length as the elongation (maximum elongation) of the terminal board 4. The result is that the header lead 2 is lifted upward and the solder 8 is subjected to tension each time of temperature rise.

The construction as mentioned above in which the solder is subjected to tensile stress is not desirable for an improvement in the thermal fatigue resistance. The inventors have studied intensively the construction of the terminal board 4, and have succeeded in improving the thermal fatigue resistance by inventing the construction as described below.

Figure 6:
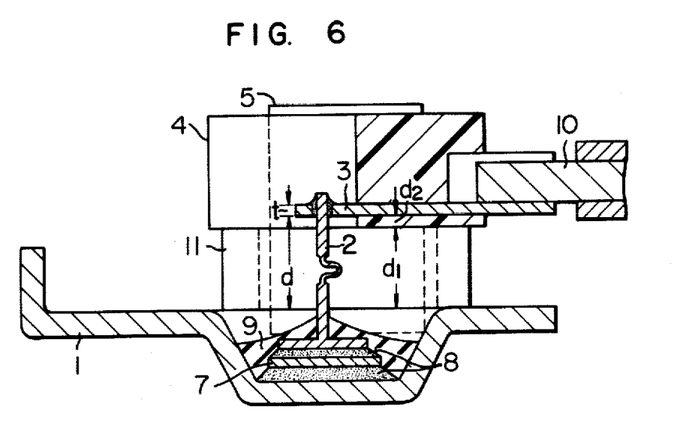
FIG. 6 is a longitudinal sectional view of a semiconductor device according to a second embodiment of the present invention.

A longitudinal sectional view of the semiconductor device according to the second embodiment of the present invention is shown in FIG. 6. The general structure of the semiconductor device according to the present invention is substantially similar to that of the semiconductor devices shown in FIG. 5 in that the four lead terminals 3 are secured by one terminal board 4 and the pins 5 for securing the terminal board 4 are located at the same positions. The semiconductor device according to the present invention, however, is different from the conventional devices in that unlike the conventional device having the lead terminal 3 embedded near the upper surface of the terminal board 4, the lead terminal 3 according to the invention is embedded in the terminal board 4 at a position near the lower surface thereof (that surface nearer to the heat-radiating electrode plate 1) and that the spacer 11 is inserted between the terminal board 4 and the heat-radiating electrode plate 1. The spacer 11 is made of a material such as an Fe-Ni or Fe-Ni-Co alloy lower in the thermal expansion coefficient than the header lead 2, i.e., copper in the case under consideration. The spacer 11, however, need not necessarily be made of metal in order to achieve the objects of the invention. The thickness of the spacer 11 should be such that the coating material 9 is not thermally affected when the header lead 2 is soldered to the lead terminal 3. In FIG. 6, the spacer 11 is illustrated in the form of ring having an inside diameter larger than the outside diameter of the fastening pin 5, although the spacer 11 is not necessarily annular in shape. Notwithstanding, it is preferably annular in shape in view of the operational efficiency of assembling the rectifier.

The stress in axial direction (thermal stress) of the header lead 2 according to the construction of the present invention is dependent on the difference in the thermal expansion coefficient among the header lead 2, the spacer 11 and the terminal board 4 located between the lead terminal 3 and the heat-radiating electrode plate 1.

According to the present invention, the lead terminal 3 is embedded in the vicinity of the lower surface of the terminal board 4 so that the distance $d_2$ between the terminal 3 and the lower surface of the terminal board 4 is sufficiently small. As a result, even though the terminal board 4 of plastics is large in the thermal expansion coefficient, the variation in the value $d_2$ with thermal expansion is sufficiently small. Also, the material of the spacer 11 is so small in the thermal expansion coefficient that the change in thickness $d_1$ with thermal expansion is sufficiently small. In this way, the change in the length d of the portion of the header lead 2 corresponding to the distance between the lead terminal 3 and the heat-radiating electrode plate 1 due to thermal expansion is larger than the sum of changes in $d_1$ and $d_2$. Thus, the force directed downward to the heat-radiating plate 1 is exerted on the header lead 2, with the result that compressive stress is applied to the solder 8.

Next, a second embodiment of the invention will be described. A thermal fatigue resistance test has been conducted on the rectifier of the conventional construction shown in FIG. 3 and the rectifier of the construction according to the second embodiment of the present invention under the same testing conditions, and the number of cycles before the breakdown thereof have been compared. The conventional construction and the construction according to the present invention are different only in the manner in which the terminal is embedded in the terminal board 4 and presence or absence of the spacer 11 as explained above, both constructions being identical to each other in all the other respects including the size of the terminal board and the distance d of 6 mm between the lead terminal 3 and the heat-radiating electrode plate 1. The lead wire 2 is made of copper containing no oxygen and has a diameter of 0.8 mm. The terminal board 4, on the other hand, is made of plastics, $40 \times 10^{-6}/°C$. in the thermal expansion coefficient and 8 mm thick, while the terminal has the thickness t of 0.8 mm. The spacer 11 used in the device of the present invention takes an annular form of a iron-nickel-cobalt alloy 5 mm thick and $5 \times 10^{-6}/°C$. in the thermal expansion coefficient. The lead terminal 3 is 1 mm distant from the lower surface of the terminal board 4.

From these results of the test conducted on the above-mentioned embodiment, it is noted that the present invention is very effective in improving the resistance to thermal fatigue. Description was made above of the case in which four header leads 2 are secured by one terminal board 4. The present invention, however, is applicable of course also to the case where one header lead is secured by one terminal board 4. Also, instead of embedding the lead terminal 3 in the terminal board 4, the lead terminal may alternatively be secured by a bonding agent or like on a thin plate of an insulating material or like with equal effect without departing from the spirit of the invention if it is not inconvenient for assembly or operation. Further, the present invention is of course effectively applied to not only the recitifer mounted on the AC dynamo for the automobiles but also to the other semiconductor devices thus far posing the problem of a small resistance to thermal fatigue.

Next, to facilitate the understanding of the third embodiment of the present invention having the alleviating means in the lead terminal 3, an example of the conventional construction of the lead terminal will be explained with reference to FIG. 7.

Figure 7:
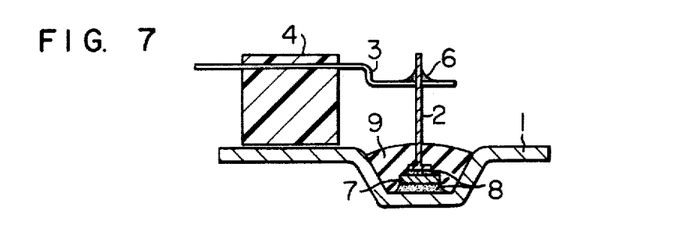
FIG. 7 is a longitudinal sectional view of a semiconductor device for explaining the form of a conventional lead terminal.

In FIG. 7, the silicon pellet 7 is fixed on the heat-radiating electrode plate 1 by the solder 8 and sealed by resin 9 such as silicon rubber. The quality of the resin 9 have been so improved that a sufficiently high breakdown voltage is maintained without using a can package which has thus far been employed.

In the case of can package, however, there is no need to take special care of the connection between the input terminal and the diode lead due to the strong construction of the can package. The construction shown in FIG. 7 which has no can package, on the other hand, requires special care as a method wherein the lead is secured to the side of the heat-radiating electrode plate 1 opposite to the side thereof provided with the silicon pellet 7.

According to the conventional methods of securing the header lead 2, the lead terminal 3 is deformed in steps as shown in FIG. 7, or a molding material such as epoxy resin is covered on the silicon rubber 9. In the latter method, a harmful substance is extracted from the silicon rubber while the epoxy resin is being set, or heat radiation through the silicon rubber 9 is prevented.

In the former method, no such adverse effects are observed. In spite of it, if the thermal expansion coefficient of the terminal board 4 of an insulating material supporting in insulative fashion the lead terminal 3 extending parallelly with the heat-radiating electrode plate 1 is higher than that of the copper header lead 2, the temperature rise in the operation of the device causes the copper header lead 2 to be lifted so that a tensile load is imposed on the copper header lead 2, silicon pellet 7 and the solder 8 that is a bonding agent for the heat-radiating electrode plate 1, in view of the fact that the copper header lead 2 and the lead terminal 3 are secured to each other by the solder 6.

This diode also lengthens its heat history each time the automobile runs or stops, leading to thermal stress imposed due to the difference in the thermal expansion coefficient among silicon, copper and the material of the heat-radiating electrode plate. As a result, the solder 8 is subjected to thermal fatigue and, after a certain length of time, the solders develop a crack, so that the bonding strength between the silicon pellet 7, the copper header lead 3 and the heat-radiating electrode plate 1 is weakened, thereby increasing the electrical and thermal resistances. Especially in the case where the thermal expansion coefficient of the terminal board 4 of an insulating material is larger than that of the copper header lead 2, as explained above, tension is applied to the copper header lead 2, thus promoting the deterioration of the characteristics.

A third embodiment of the present invention concerns a semiconductor device having a lead terminal capable of improving the resistance to thermal fatigue which constitutes one of the principal characteristics of the diode bridge for the automobile.

According to the third embodiment of the invention, the part of the lead terminal 3 between the terminal board 4 of an insulating material and the copper header lead 2 is formed in the shape of Ω, with the result that the thermal stress caused in the bonding part between the silicon pellet 7 and the copper header lead 2 and between the silicon pellet 7 and the heat-radiating electrode plate 1 by the difference in the thermal expansion coefficient between the terminal board 4 of an insulating material and the copper header lead 2 is reduced.

The third embodiment of the present invention will be described with reference to FIG. 8. The silicon pellet 7 is a diode pellet having a nickel-plated contact fabricated by the diffusion process or nickel plating process well known to those skilled in the art. This silicon pellet 7 is soldered to the copper header lead 2 which is provided with a U-shaped bent part like the first embodiment, and the heat-radiating electrode pate 1 in a pure hydrogen furnace by use of the solder 8 with the main component of lead. After the soldering process, the end surfaces of the silicon pellet 7 are cleaned with a diluted alkaline solution of caustic soda, and then the surface of the silicon pellet is protected by the silicon rubber 9.

Figure 8:
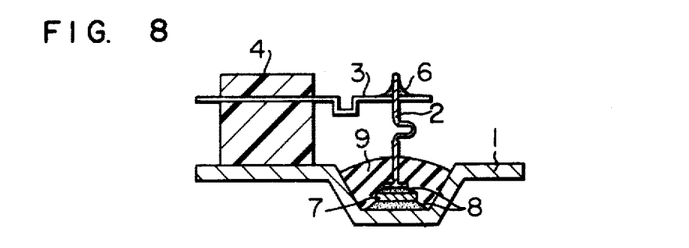
FIG. 8 is a longitudinal sectional view of a semiconductor device using lead terminals according to a third embodiment of the present invention.

On the other hand, the lead terminal 3 made of a metal plate as thin as 0.2 mm to 0.3 mm and 3 mm to 5 mm wide having a sectional shape as shown in FIG. 8 is molded with the terminal board 4 of an insulating material at a position as near to the heat-radiating electrode plate 1 as possible.

The lead terminal 3 is soldered with the copper header lead 2 of the diode by means of the solder 6. Even though the thermal expansion coefficient of the terminal board 4 of an insulating material is larger than that of the copper header lead 2, the difference is absorbed effectively by the Ω-shaped part of the lead terminal 3, so that no tensile stress is imposed on the copper header lead 2.

This effect is especially conspicuous if the Ω-shaped part is annealed or otherwise treated to mitigate the hardening in the forming process.

Figure 9:
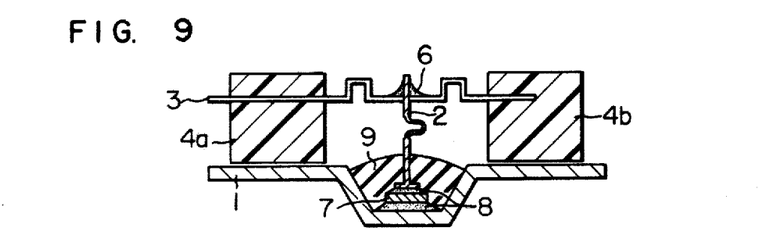
FIG. 9 is a longitudinal sectional view of a semiconductor device using lead terminals according to a fourth embodiment of the present invention.

According to a fourth embodiment shown in FIG. 9, the lead terminal 3 is supported on both sides of the copper header lead 2 by the terminal boards 4a and 4b of an insulating material fixed on the heat-radiating electrode plate 1, and the silicon pellet 7 is soldered to copper header lead 2 which is provided with U-shaped bent part like the first embodiment.

In this case, the Ω-shaped parts are provided on both sides of the copper header lead 2. Unlike in the embodiment of FIG. 8, the Ω-shaped parts have the openings thereof facing the heat-radiating electrode plate 1. In this construction, the solders between the silicon pellet 7, copper header lead 2 and the heat-radiating electrode plate 1 are not subjected to thermal stress.

This terminal construction is applicable not only to the three-phase diode bridge but to the various types of diodes of semiconductor devices.

Figure 10A:
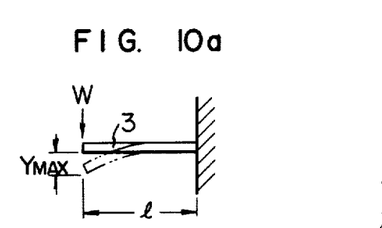
FIG. 10a shows a model of the relation between load and bending.
Figure 10B:
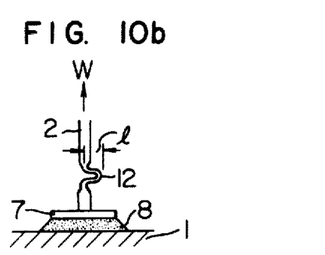
FIG. 10b is a diagram showing the relation between load and bending of the header lead.

The functions of the cushion 12 of the header lead 2 will be described in detail below with reference to FIGS. 10a and 10b.

Let the temperature rise of the semiconductor device be $\Delta T$, the thermal expansion coefficient of the terminal board 4, $\alpha_1$ and the thermal expansion coefficient of the header lead 2, $\alpha_2$. The difference $\Delta\epsilon$ in elongation between the terminal board 4 and the header lead 2, and the tension (load) W exerted on the header lead 2 are given as below.

$$\Delta\epsilon = (\alpha_1 - \alpha_2) \times \Delta T$$

$$W = A \times \Delta\epsilon \times E$$

where A is the sectional area of the header lead 2, and E Young's modulus of the header lead 2. Thus, the bending $Y_{MAX}$ under the load applied to the header lead 2 as shown in FIG. 10a is expressed as $$Y_{MAX} = \frac{W}{3EI} l^3 l$$

where I is the second moment of area. It is seen that with the increase in the length l, the degree of bending is increased. In connecting the header lead 2 with the lead terminal 3 by means of the solder 8 as described above, the drooping of solder if any on the cushion 12 adversely affects the bending characteristics.

The semiconductor device is cooled by the heat-radiating electrode plate 1. With a thermocouple mounted on the part of the heat-radiating electrode plate 1 direct under the silicon chip, the three-phase rectified current is supplied to increase the temperature up to $T_1$ and then the current is cut off to reduce the temperature down to $T_2$. This cycle is repeated while at the same time drawing a temperature rise curve for the forward end of the header lead 2. The result shows that the ceiling of temperature rise of the header lead 2 is about 90% of the temperature $T_1$ of the heat-radiating electrode plate 1, and the minimum thereof is $T_2$. By improving the radiation from the header lead, therefore, the life of the semiconductor device is lengthened.

A fifth embodiment of the present invention takes the above-mentioned points into consideration and concerns a semiconductor device having a novel construction of the soldered portion of the lead terminal 3 for connecting the header lead 2.

Figure 11:
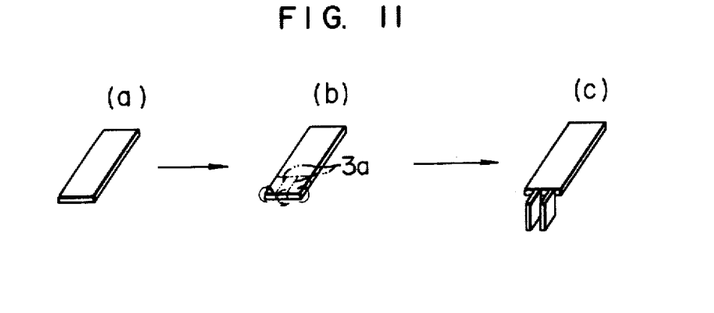
FIG. 11 is a diagram showing the processes of fabrication of the lead terminals according to a fifth embodiment of the invention.

The processes for fabricating the lead terminal 3 according to the present embodiment are shown in (a), (b) and (c) of FIG. 11. First, a copper or iron flat plate with the desired width as shown in (a) is blanked, and cut in along the lines 3a in order that the lead terminal 3 may be bent for contact with the header lead 2, as shown in (b). The depth of the cuts should be so determined as to provide a gap of 0.1 mm to 0.2 mm with respect to the diameter of the header lead 2 contacted by the lead terminal 3. Next, as shown in (c), the blank is bent into the shape of ], thereby completing the lead terminal 3.

A sectional view of the semiconductor device according to the fifth embodiment of the present invention using the lead terminal 3 fabricated as described above is shown in FIG. 12.

Figure 12:
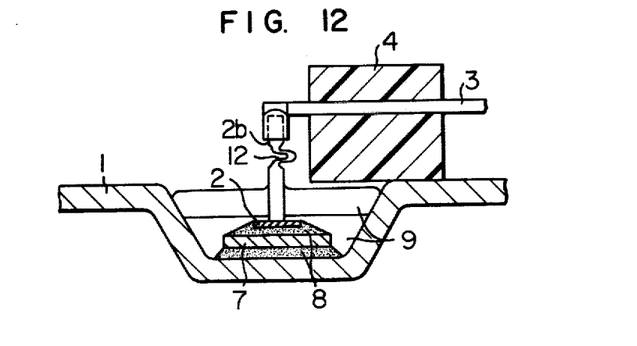
FIG. 12 is a longitudinal sectional view of the semiconductor device using the lead terminals shown in FIG. 11, according to the present invention.

By adopting the method according to the present invention, the solder droop caused at the time of soldering the header lead 2 and the lead terminal 3 is blocked at the terminal 2b by capillarity and surface tension since the end of the lead terminal 3 holds the substantial length of the lead section of the header lead, thus enabling the cushion 12 to fully display its advantage. Further, in view of the fact that the lead terminal 3 is in contact with the periphery of the header lead 2, the radiation area is accordingly increased, thereby improving the radiation effect of the semiconductor device as a whole.

Figure 13:
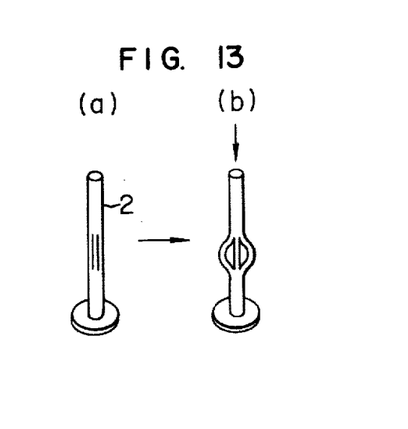
FIG. 13 is a diagram showing the processes of fabrication of the header leads according to a sixth embodiment of the present invention.

The processes for fabricating the header lead according to the sixth embodiment of the present invention are shown in (a) and (b) of FIG. 13. In the sixth embodiment, the header lead is nail-shaped thereby to facilitate the assembly thereof on the one hand, and a cross slit is formed in the header lead in the axial direction the eof thereby to compress and deform the header lead for absorbing mechanical vibrations on the other hand, thus achieving mechanical characteristics similar to those of the conventional devices.

Application of the leader head according to the sixth embodiment is therefore not limited to the semiconductor device mentioned above but also to a multi-purpose thyristor, and results in simplifaction of assembly processes and lower cost without adversely affecting the mechanical or electrical characteristics of the semiconductor device.

Figure 14:
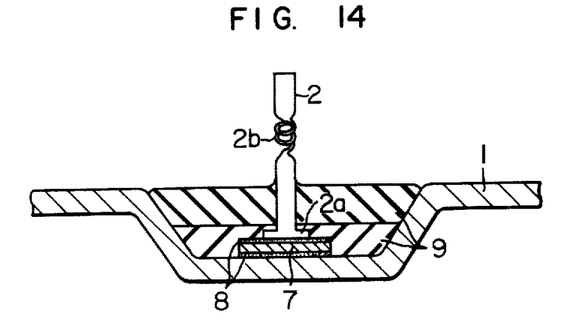
FIG. 14 is a longitudinal sectional view of a semiconductor device using the header leads according to a seventh embodiment of the present invention.

A seventh embodiment of the present invention will be described below. A longitudinal sectional view of a semiconductor device using the header lead 2 according to the seventh embodiment is shown in FIG. 14. The seventh embodiment provides a semiconductor device with a coiled part in the middle of the header lead 2 and high in resistance to vibrations.

In the processes of fabricating the header lead 2, a wire-drawn copper material is first cut and the header section 2a is machined, followed by the forming of the coiled part in the middle of the lead section 2b. In this case, the header section 2a may be either circular or rectangular, and the coiled part may comprise at least one turn. In the seventh embodiment, the coiled part 2b is formed in the part of the header lead exposed out of the sealing agent 9 for the reasons described below.

Assume that the coiled part is provided within the sealing agent 9. When the semiconductor device is operated with the upper end of the header lead 2 soldered or welded to an external terminal, the tension, compressive force or bending force applied to the header lead 2 would substantially fail to be absorbed in view of the fact that the coiled part is fixed by the sealing agent 9. According to the embodiment under consideration, by contrast, all such forces are absorbed at the coiled part.

Figure 15:
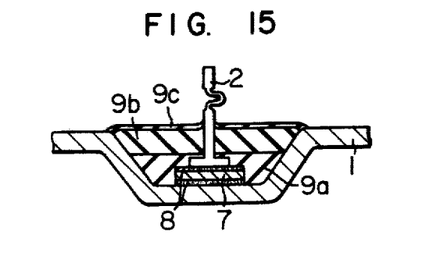
FIG. 15 is a longitudinal sectional view of a semiconductor device according to an eight embodiment of the invention.

Next, the semiconductor device according to an eight embodiment of the present invention will be described. A longitudinal sectional view of the semiconductor device according to the eight embodiment is shown in FIG. 15.

Generally, the semiconductor device is mounted within the automobile engine and therefore the resistance thereof to gasoline, oil, salt water, water and heat constitutes an important specification. Notwithstanding, the conventional semiconductor device covered with silicon rubber as a junction surface passivator 9a and a simple sealing agent 9b has the shortcomings as mentioned below.

A general structural formula of silicon rubber is where R shows a methyl radical ($CH_3$) containing a slight amount of vinyl radical ($CH_2=CH$). The fact that the methyl radical ($CH_3$) and the vinyl radical ($CH_2=CH$) are contained provides a practically sufficient resistance to heat but not to gasoline and water. Especially when the silicon rubbers 9a and 9b are immersed for long time in gasoline, they are swollen, thereby deteriorating the electrical characteristics of the semiconductor device proper.

An object of the eighth embodiment of the present invention is to provide a semiconductor device which, retaining the advantages of silicon rubber, eliminates the shortcomings of the conventional semiconductor devices by covering the silicon rubbers 9a and 9b with a protective film high in resistance to both solvents and heat in order to improve the air-tightness of the silicon rubber.

The eight embodiment will be described below with reference to FIG. 15. In the drawing, reference numeral 7 is a silicon chip comprising a silicon pellet having a Pnn+ diffused layer and with the surface thereof plated with nickel as a contact material. On the sides of the silicon chip 7 are attached a header lead 2 making up n anode electrode (or cathode electrode) and a heat-radiating electrode plate 1 (base plate) acting as a cathode electrode (or anode electrode) through the lead solders 8, and the assembly is soldered by being heated in a pure hydrogen environment of a soldering oven.

After soldering, the contamination on the surface of junction of the silicon chip 7 is removed by etching in a caustic soda solution and sufficiently washed in water. The assembly is dewatered by aceton and dried in nitrogen gas. For passivation of the junction surface of the silicon chip 7, the silicon rubber 9a and the simple air-tight silicon rubber 9b are filled. Further, silicon rubber 9c with fluorine added thereto as a feature of the eighth embodiment under consideration is coated on the assembly by a brush to the thickness of about 100 μ.

The electric characteristics of the semiconductor device produced through the above-mentioned processes are tested, thus completing the device according to the embodiment under consideration.

Instead of the silicon rubber 9c containing fluorine coated according to the present embodiment a Teflon material may alternatively be used for improving the air-tightness.

As explained above, the embodiment under consideration includes a protective film as the outermost layer high is resistance both to solvents and heat, thereby producing a semiconductor device still higher in air-tightness.

A semiconductor device according to a ninth embodiment of the present invention will be described below.

Figure 16:
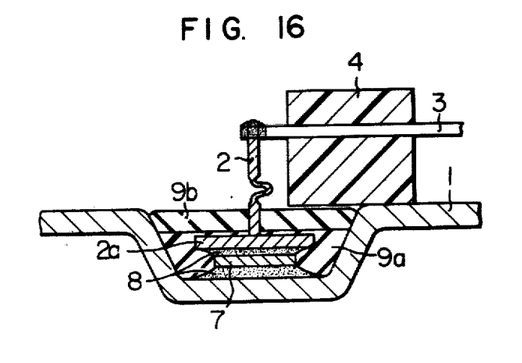
FIG. 16 is a longitudinal sectional view of a semiconductor device according to a ninth embodiment of the invention.

A longitudinal sectional view of the semiconductor device according to the ninth embodiment of the invention is shown in FIG. 16.

A general object of a copper plate used between the header lead and the semiconductor element is to use it as a heat storage for alleviating the sudden heating effect of a power surge. In other words, in view of the very high heat conductivity of copper, the copper plate attached on the upper surface of the semiconductor element 7 causes heat generated by the power surge to be transmitted to the copper plate rapidly and radiated to an external heat-absorbing material through the lead terminal 3. As a result, the temperature of the semiconductor element rises only slightly.

The fabrication of the semiconductor of the above-mentioned construction is so troublesome that the solder material 8 is first placed on the heat-radiating electrode plate 1, and then a semiconductor element 7, the solder 8, the copper plate, another solder 8, and the header lead 2 are stacked in that order on the assembly.

This troublesome assembly work results in a high processing cost, and that the need of plating the surface of the copper plate to assure the solderability of the copper plate leads to high material cost. Another great problem posed in this configuration is the soldering of the coper plate used as an anode or cathode electrode of the semiconductor device. It is required that the solder material direct under the copper plate be uniform in thickness. In the configuration under consideration in which many items of components involved are laid one on another by troublesome assembly processes, however, it is difficult to produce uniform products, with the result that the copper plate is tilted actually with respect to the surface of the semiconductor element 7, thus making it impossible to produce a uniform thickness of the solder. Upon application of thermal cycles to the semiconductor device under this condition, the difference in the thermal expansion coefficient between the copper plate and the semiconductor element 7 causes a shearing stress to be exerted on the solder material 8. This phenomenon is especially conspicuous for the part of the solder material small in thickness, often resulting in the breakdown due to fatigue of the solder material 8.

The embodiment under consideration has been developed in order to obviate the above-mentioned shortcomings of the conventional semiconductor device and has an object to provide a low-cost semiconductor device capable of resisting a surge current without losing the functions of the copper plate of the conventional device.

According to the embodiment under consideration, the functions of the copper plate are performed by the header section of the header lead 2 thereby to reduce the number of the required component parts. This embodiment will be described below with reference to FIG. 16.

The diagram of FIG. 16 shows the header lead 2 which is provided with U-shaped bent part like the first embodiment. In addition, the header section 2a of the header lead 2 is circular or rectangular in shape, and has an area at least as large as the semiconductor element 7. The header section 2a is made of a copper material very high in thermal conductivity, and the surface thereof is silver-plated to improve the solderability thereof with the solder material. Further, the header section 2a has a thickness sufficient to act as a heat storage taking into consideration the heat capacity of the copper material and the mass of the header section 2a.

A semiconductor device assembled by use of the header lead 2 mentioned above is illustrated in FIG. 16. The semiconductor element is fixed on the internal bottom of the cup-shaped (depressed) heat-radiating electrode plate 1 by the solder material 8. The header section 2a of the header lead 2 is soldered on the upper surface of the semi-conductor element 7 by means of the solder material 8. As a surface treatment agent, silicon rubber 9a is injected in the depressed portion of the heat-radiating electrode plate 1. Further, the opening of the heat-radiating electrode plate 1 is closed by the sealer 9b, thereby fixing the lead 2.

In the semiconductor device described above, the use of the header lead 2 having the header section 2a as shown in FIG. 16 reduces the number of component parts of the semiconductor device and simplifiers the assembly processes which otherwise would be troublesome. Further, each component part is set in position without any special techniques thus for required, resulting in a low processing cost, in addition to the decrease in material cost by elimination of the copper plate. Furthermore, in view of the fact that the component parts are set in position, the solder material between the semiconductor element 7 and the header section 2a of the header lead 2 is uniform in thickness. This makes it easy to secure the required uniform solder thickness on the one hand and reduces the hazard of thermal fatigue breakdown of the solder on the other hand.

It will be understood from the foregoing description that according to the present embodiment, a low-cost semiconductor device is produced, which is capable of resisting a surge current and has a lesser tendency toward thermal fatigue breakdown of the solder material, without losing the functions of the copper plate used with the conventional semiconductor device.

The embodiment under consideration is of course not limited to the specific semiconductor device shown in the drawing but is applicable to other devices with equal effect.

We claim:

1. A semiconductor device comprising a heat-radiating plate including a depressed portion, a semiconductor element soldered to said heat-radiating plate in said depressed portion, a header lead including a lead section extending in a direction perpendicular to said heat-radiating plate and a header section located at one end of said lead section and soldered onto said semiconductor element, a terminal board fixed on said heat-radiating plate, wherein said lead section has a bent portion thinner than the rest of the lead section, a lead terminal supported by said terminal board and electrically and mechanically connected to the other end of said lead section, an elastic insulating material filled into said depressed portion covering and providing air-tight sealing for said semiconductor element and said header section, said bent portion of said lead section being exposed outside of said insulating material so that said bent portion can alleviate transmission of a stress generated along the length of said lead section to said solder without separating said insulating material from said heat-radiating plate.

2. A semiconductor device according to claim 1, in which said bent portion is a U-shaped bent part formed in said lead section.

3. A semiconductor device according to claim 1, in which said bent portion is a cross-shaped slit formed in said lead section.

4. A semiconductor device according to claim 1, in which said bent portion is a coiled part formed in said lead section.

5. A semiconductor device according to claim 1, in which at least one spacer of a material smaller in the coefficient of thermal expansion than said lead section is inserted between said heat-radiating plate and said terminal board.

6. A semiconductor device according to claim 1, in which said lead terminal includes means for alleviating the stress generated along the length of said lead section, said means being interposed between said terminal board and said lead section.

7. A semiconductor device according to claim 6, in which said alleviating means in said lead terminal is a U-shaped bent part.

8. A semiconductor device according to claim 1, in which said lead terminal includes means for holding said lead section along the substantial length of said lead section.

9. A semiconductor device according to claim 1, 2, 4, 5, 6, 7 or 8, in which said header section and said lead section are made of iron and copper respectively.

10. A semiconductor device according to claim 1, 2, 3, 4, 5, 6, 7 or 8, in which the area of said header section is larger than that of said semiconductor element.

11. A semiconductor device according to claim 1, wherein said insulating material comprises silicon rubber for passivation and easy air-tightness of the junction surface of said semiconductor element fixed on said heat-radiating electrode plate, and a surface protective film high in resistance to solvents and heat, said surface protective film being covered on said insulating material of silicon rubber in order to improve the air-tightness characteristics.

12. A semiconductor assembly comprising a plurality of semiconductor devices each including: a heat-radiating plate including a depressed portion; a semiconductor element soldered to said heat-radiating plate in said depressed portion; a header lead having a lead section extending in a direction perpendicular to said heat-radiating plate and a header section located at one end of said lead section and soldered onto said semiconductor element, wherein said lead section has a bent portion thinner than the rest of the lead section, a terminal board fixed on said heat-radiating plate; a lead terminal supported by said terminal board and electrically and mechanically connected to the other end of said lead section; an elastic insulating material filled into said depressed portion covering and providing an air-tight sealing for said semiconductor element and said header section, said bent portion of said lead section being exposed outside of said insulating material so that said bent portion can alleviate transmission of a stress generated along the length of said lead section to said solder without separating said insulating material from said heat-radiating plate, said heat-radiating plates of said semiconductor devices being formed into a pair of circular arc-shaped heat-radiating electrode plates mounted on the circumferential part of the end bracket of an AC generator symmetrically with respect to the diameter, said terminal boards of said semiconductor devices being formed into a couple of insulating members mounted along the outer periphery of said respective heat-radiating electrode plates.

13. A semiconductor assembly according to claim 12, in which each of said lead terminals includes a U-shaped part.

14. A semiconductor assembly according to claim 12, in which a plurality of depressed portions are formed substantially along a circumferential part of said heat-radiating electrode plates, and each of said semiconductor elements is mounted in each of said depressed portions.

15. A semiconductor assembly according to claim 12, in which the end of said lead terminal to which the header lead of said semiconductor element is connected has an opening in the shape of U in the radial direction.

16. A semiconductor assembly according to claim 12, in which said insulating members are so arranged that the inner periphery of said respective insulating members cover at least part of the depressed portions of said heat-radiating electrode plates which are provided with said semiconductor elements.

17. A semiconductor assembly according to claim 12, in which said semiconductor elements are disposed on the inner periphery side of said insulating members.

18. A semiconductor assembly according to claim 12, in which places where said insulating members are fixed on said heat-radiating electrode plates are different from the places where said lead terminals are fixed on said insulating members so as to extend in a radial direction of said heat-radiating electrode plates.

19. A semiconductor device according to claim 1, 2 or 12, wherein the insulating material covers the header section which is soldered onto the semiconductor element and a portion of the lead section which extends perpendicular to the heat-radiating plate, with the bent portion being located along said portion of said lead section which is not covered by said insulating material.

20. A semiconductor device according to claim 2, 3 or 4, wherein the bent portion is formed substatially in the middle of the lead section.

21. A semiconductor device according to claim 5, wherein the lead terminal is located in a lower portion of the terminal board.

* * * * *